(12) United States Patent
Li

(10) Patent No.: US 9,395,576 B2
(45) Date of Patent: Jul. 19, 2016

(54) ORGANIC LIGHT EMITTING DIODE DISPLAY DEVICE, MANUFACTURING METHOD FOR THE SAME AND DISPLAY SYSTEM

(71) Applicant: BOE Technology Group Co., Ltd., Beijing (CN)

(72) Inventor: Wenbo Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 361 days.

(21) Appl. No.: 13/994,737

(22) PCT Filed: Oct. 18, 2012

(86) PCT No.: PCT/CN2012/083155
§ 371 (c)(1),
(2) Date: Jun. 16, 2013

(87) PCT Pub. No.: WO2013/107194
PCT Pub. Date: Jul. 25, 2013

(65) Prior Publication Data
US 2014/0055718 A1 Feb. 27, 2014

(30) Foreign Application Priority Data
Jan. 16, 2012 (CN) .......................... 2012 1 0013274

(51) Int. Cl.
*G02F 1/1335* (2006.01)
*G02F 1/1347* (2006.01)
(Continued)

(52) U.S. Cl.
CPC ........ *G02F 1/133603* (2013.01); *G02F 1/1333* (2013.01); *G02F 1/1347* (2013.01); *G02F 1/13471* (2013.01); *H01L 27/3232* (2013.01)

(58) Field of Classification Search
CPC ........................... G02F 1/13471; G02F 1/1347
See application file for complete search history.

(56) References Cited

U.S. PATENT DOCUMENTS

2002/0196401 A1* 12/2002 Grace et al. ................... 349/158
2007/0024822 A1 2/2007 Cortenraad et al.
(Continued)

FOREIGN PATENT DOCUMENTS

CN          1875391 A     12/2006
CN        201355416 Y     12/2009
(Continued)

OTHER PUBLICATIONS

International Preliminary Report on Patentability for International Application No. PCT/CN2012/083155 dated Jul. 22, 2014, 9pgs.
(Continued)

*Primary Examiner* — Phu Vu
(74) *Attorney, Agent, or Firm* — Ladas & Parry LLP

(57) ABSTRACT

Disclosed are an organic light emitting diode display device, a manufacturing method for the same and a display system, for realizing compatibility of ordinary non-transparent display and transparent display in the organic light emitting diode display device, as well as the switching between ordinary non-transparent display and transparent display. The display device comprises: a transparent organic light emitting diode (OLED) display panel (20) and a light valve component (21); the light valve component (21) is disposed on a non-display surface of the transparent OLED display panel (20); and the light valve component (21) at least has two states under electric fields: a transparent state and a non-transparent state.

8 Claims, 6 Drawing Sheets

(51) Int. Cl.
*H01L 27/32* (2006.01)
*G02F 1/1333* (2006.01)

(56) References Cited

U.S. PATENT DOCUMENTS

| | | | |
|---|---|---|---|
| 2007/0057932 A1 | 3/2007 | Shin et al. |
| 2010/0271571 A1 | 10/2010 | Zhang et al. |
| 2011/0303906 A1 | 12/2011 | Goldmann |

FOREIGN PATENT DOCUMENTS

| | | |
|---|---|---|
| CN | 101923243 A | 12/2010 |
| CN | 201796892 U | 4/2011 |
| CN | 102257651 A | 11/2011 |
| CN | 102646696 A | 8/2012 |
| CN | 202487668 U | 10/2012 |
| EP | 2169966 A2 | 3/2010 |

OTHER PUBLICATIONS

International Search Report (Chinese language) issued by the International Searching Authority, rendered Jan. 31, 2013, 11 pages.

The State Intellectual Property Office of the People's Republic of China ("SIPO") (Chinese Language) Office Action issued on Dec. 21, 2012 by SIPO in Chinese Patent Application No. 201210013274.5; ten (10) pages.

English Translation of The State Intellectual Property Office of the People's Republic of China ("SIPO") Office Action issued on Dec. 21, 2012 by SIPO in Chinese Patent Application No. 201210013274.5; eight (8) pages.

The State Intellectual Property Office of the People's Republic of China ("SIPO") (Chinese Language) Office Action issued on Jun. 5, 2013 by SIPO in Chinese Patent Application No. 201210013274.5; four (4) pages.

English Translation of The State Intellectual Property Office of the People's Republic of China ("SIPO") Office Action issued on Jun. 5, 2013 by SIPO in Chinese Patent Application No. 201210013274.5; four (4) pages.

The State Intellectual Property Office of the People's Republic of China ("SIPO") (Chinese Language) Office Action issued on Nov. 8, 2013 by SIPO in Chinese Patent Application No. 201210013274.5; seven (7) pages.

English Translation of The State Intellectual Property Office of the People's Republic of China ("SIPO") Office Action issued on Nov. 8, 2013 by SIPO in Chinese Patent Application No. 201210013274.5; six (6) pages.

The State Intellectual Property Office of The People's Republic of China ("SIPO") (Chinese Language) Office Action issued on Feb. 11, 2014 by SIPO in Chinese Patent Application No. 201210013274.5; seven (7) pages.

English Translation of The State Intellectual Property Office of The People's Republic of China ("SIPO") Office Action issued on Feb. 11, 2014 by SIPO in Chinese Patent Application No. 201210013274.5; eight (8) pages.

Espacenet Bibliographic Data, Abstract of CN102646696(A) (listed above in Foreign Patent Documents), 1 page.

Espacenet Bibliographic Data, Abstract of CN101923243(A) (listed above in Foreign Patent Documents), 1 page.

Espacenet Bibliographic Data, Abstract of CN201355416(Y) (listed above in Foreign Patent Documents), 1 page.

Espacenet Bibliographic Data, Abstract of CN202487668(U) (listed above in Foreign Patent Documents), 1 page.

Espacenet Bibliographic Data, Abstract of CN102257651(A) (listed above in Foreign Patent Documents), 2 pages.

Espacenet Bibliographic Data, Abstract of CN201796892(U) (listed above in Foreign Patent Documents), 1 page.

Espacenet Bibliographic Data, Abstract of CN1875391(A) (listed above in Foreign Patent Documents), 2 pages.

\* cited by examiner

ORGANIC LIGHT EMITTING DIODE DISPLAY DEVICE, MANUFACTURING METHOD FOR THE SAME AND DISPLAY SYSTEM

CROSS REFERENCE TO RELATED APPLICATIONS

This application is based on International Application No. PCT/CN2012/083155 filed on Oct. 18, 2012, which claims priority of Chinese National Application No. 201210013274.5 filed on Jan. 16, 2012 the contents of which are incorporated herein by Reference.

TECHNICAL FIELD

Embodiments of the present invention relate to an organic light emitting diode display device, a manufacturing method for the same and a display system.

BACKGROUND

Organic Light Emitting Diode (OLED) display devices belong to a new type flat panel display device, with such characteristics as lightness, thinness, high brightness, wide color gamut, quick response, etc.

An OLED display panel mainly comprises a substrate, a first electrode formed on the substrate for injecting charges of a first polarity, a second electrode arranged on the first electrode for injecting charges of a second polarity that is opposite to the first polarity, and an organic light emitting layer arranged between the first electrode and the second electrode. When a suitable biasing voltage is applied across the two electrodes, the organic light emitting layer is excited to emit light through injection, transport and recombination of carriers (electrons and holes), thus achieving the object of display.

An existing OLED display device is shown in FIG. 1, primarily comprising a substrate 101, a reflective layer 102, an anode 103, a hole injection layer 104, a hole transport layer 105, a light emitting layer 106, an electron injection layer 107, a buffer layer 108, and a cathode 109. The reflective layer 102 can improve the display brightness of the OLED.

However, the existing OLED display device may either realize a transparent display effect only, i.e. when information is normally displayed, the object behind the display device may be viewed also, or realize an ordinary non-transparent display effect only. That is to say, it is impossible to provide an OLED display device in which transparent display and original non-transparent display are compatible with each other, which brings limitations to the use by users.

SUMMARY

The embodiments of the present invention provide an organic light emitting diode display device, a manufacturing method for the same, and a display system, for realizing compatibility of ordinary non-transparent display and transparent display in the organic light emitting diode display device, as well as the switching between ordinary non-transparent display and transparent display.

One aspect of the present invention provides an organic light emitting diode display device comprising: an organic light emitting diode (OLED) display panel and a light valve component; the light valve component is disposed on a non-display surface of the transparent OLED display panel; the light valve component at least has two states under electric fields: a transparent state and a non-transparent state.

A further aspect of the present invention provides a manufacturing method for an organic light emitting diode display device, comprising: forming a third electrode of a light valve component on a first substrate of a transparent organic light emitting diode (OLED) display panel; forming a fourth electrode of the light valve component on a third substrate; and filling display medium between the third electrode and the fourth electrode to form the light valve component, wherein the light valve component at least has two states under electric fields: a transparent state and a non-transparent state.

A further aspect of the present invention provides a manufacturing method for an organic light emitting diode display device, comprising: when a first substrate of the transparent organic light emitting diode (OLED) display panel is a rigid substrate, attaching a light valve component having a flexible substrate onto the first substrate by an attaching device; or when the first substrate is a flexible substrate, attaching the light valve component having a flexible substrate onto the first substrate by a roll-to-roll device; wherein the light valve component at least has two states under electric fields: a transparent state and a non-transparent state.

A further aspect of the present invention provides a display system, which comprises the aforementioned display device.

The embodiments of the present invention dispose a light valve component on a non-display surface of the OLED display panel; the light valve component at least has two states under electric fields, i.e. a transparent state and a non-transparent state, thereby the switching between ordinary non-transparent display and transparent display of the display device may be realized, and ordinary non-transparent display and transparent display is compatible with each other in the display device. By combining such characteristics as light weight and thinness of the OLED display panel per se, disposing the light valve component on the OLED non-display surface may provide the users with improved experience.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

In order to realize the compatibility of ordinary non-transparent display and transparent display in the organic light emitting diode display device and the switching between ordinary non-transparent display and transparent display, the embodiments of the present invention provide an organic light emitting diode display device, a manufacturing method thereof and a display system.

Some preferred embodiments of the present invention will be described in detail below with reference to the accompanying drawings.

Figure 1:
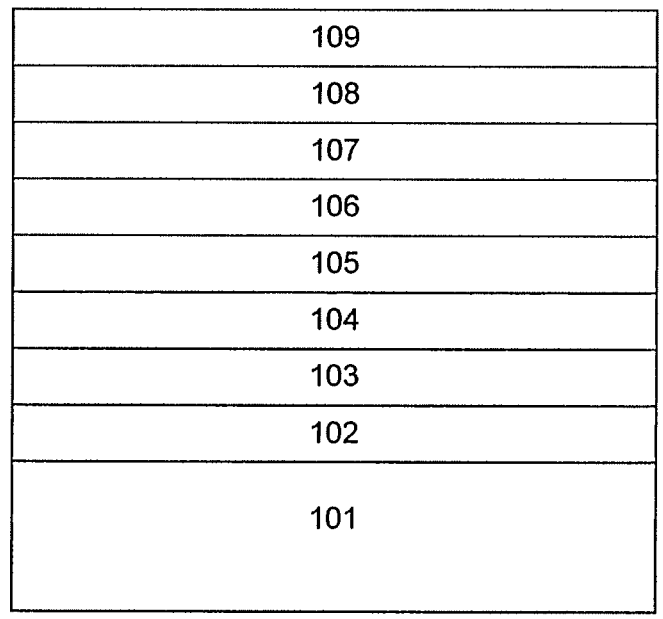
FIG. 1 is a cross-sectional structural schematic view of an existing OLED display device.
Figure 2:
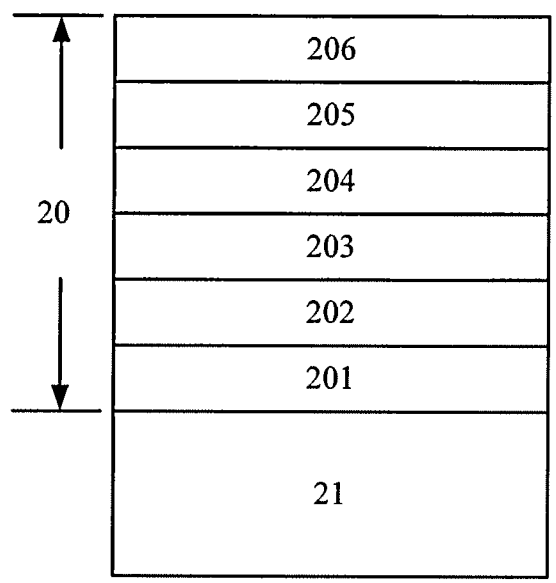
FIG. 2 is a cross-sectional structural schematic view of an OLED display device in an embodiment.

As shown in FIG. 2, the organic light emitting diode display device provided in an embodiment of the present invention mainly comprises a transparent OLED display panel 20 and a light valve component 21. The light valve component 21 is provided on a non-display surface of the transparent OLED display panel 20. The light valve component 21 at least has two states under an electric field, i.e., a transparent state and a non-transparent state.

To be specific, the transparent OLED display panel 20 comprises a first substrate 201, and a first electrode 202, a first transport layer 203, a light emitting layer 204, a second transport layer 205 and a second electrode 206 sequentially disposed on the first substrate 201.

When the light valve component 21 is in a non-transparent state, a user may only view the contents normally displayed on the display device per se with the OLED display panel. When the light valve component 21 is in a transparent state, under the action of environmental light, the user may view both the objects behind the light valve component 21, through the OLED display panel 20 and the light valve component 21, and the contents normally displayed on the display device per se, i.e., the OLED display panel realizes the effect of transparent display, which allows the user to observe the objects behind the display device or the environmental activities while viewing the contents displayed on the display device. The light valve component 21 provides the compatibility of ordinary non-transparent display and transparent display in the display device and realizes the switching between transparent display and ordinary non-transparent display.

The non-transparent state of the light valve component 21 may be at least a scattering state or a dark state. When it is in the scattering state, the light valve component 21 may further acts as a reflective plate to improve the light output of ordinary non-transparent display and to improve the display effect.

Figure 3:
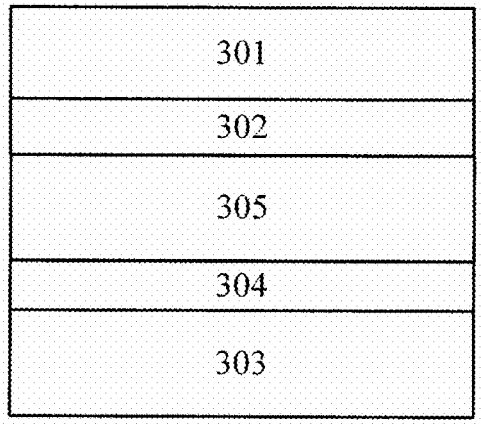
FIG. 3 is a cross-sectional structural schematic view of a light valve component in an embodiment.

In the present embodiment, as shown in FIG. 3, one example of the light valve component 21 comprises a second substrate 301, a third electrode 302 disposed on the second substrate 301, a fourth substrate 303, a fourth electrode 304 disposed on the third substrate 303, and a display medium 305 between the third electrode 302 and the fourth electrode 304. For example, each of the second substrate 301, the third substrate 303, the third electrode 302 and the fourth electrode 304 is made of a transparent material.

In an implementation way, the first substrate 201 of the OLED display panel can serve as the second substrate 301 of the light valve component 21 at the same time, i.e. the third electrode 302 is disposed on the side of the first substrate 201 facing the light valve component 21.

Preferably, the light valve component 21 may be at least any one of a polymer dispersed liquid crystal (PDLC) optical switch device, a cholesteric liquid crystal optical switch device, an electrochromic (EC) optical switch device, an electrowetting optical switch device, and an optical switch device which has a polarizer. The optical switch device having a polarizer may be at least of Twisted Nematic (TN) type, Vertical Alignment (VA) type, In-plane Switching (IPS) type, Fringe Field Switching (FFS) type, etc..

Figure 4:
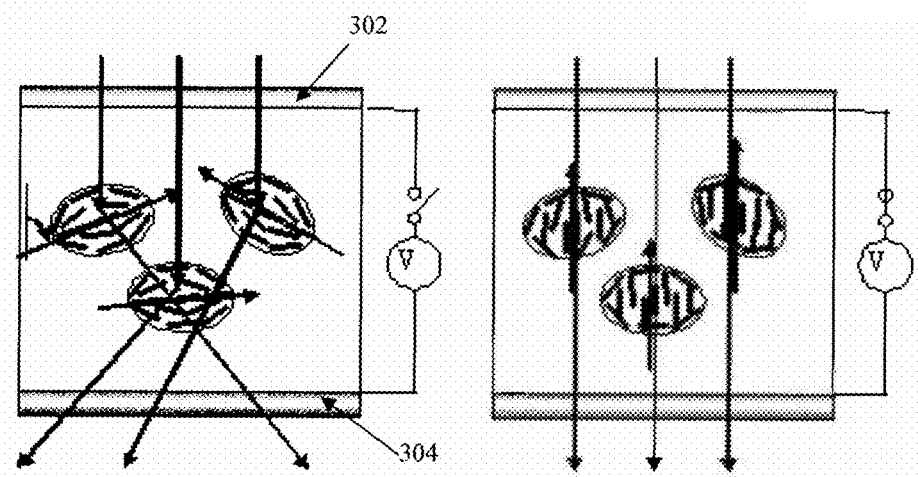
FIG. 4 is a schematic view showing the states of a PDLC optical switch device in an embodiment.

For example, as shown in FIG. 4, when the light valve component 21 is a PDLC optical switch device, the PDLC is in a scattering state if there is no voltage is applied, and it is in a transparent state when a predetermined voltage is applied across the third electrode 302 and the fourth electrode 304.

Figure 5:
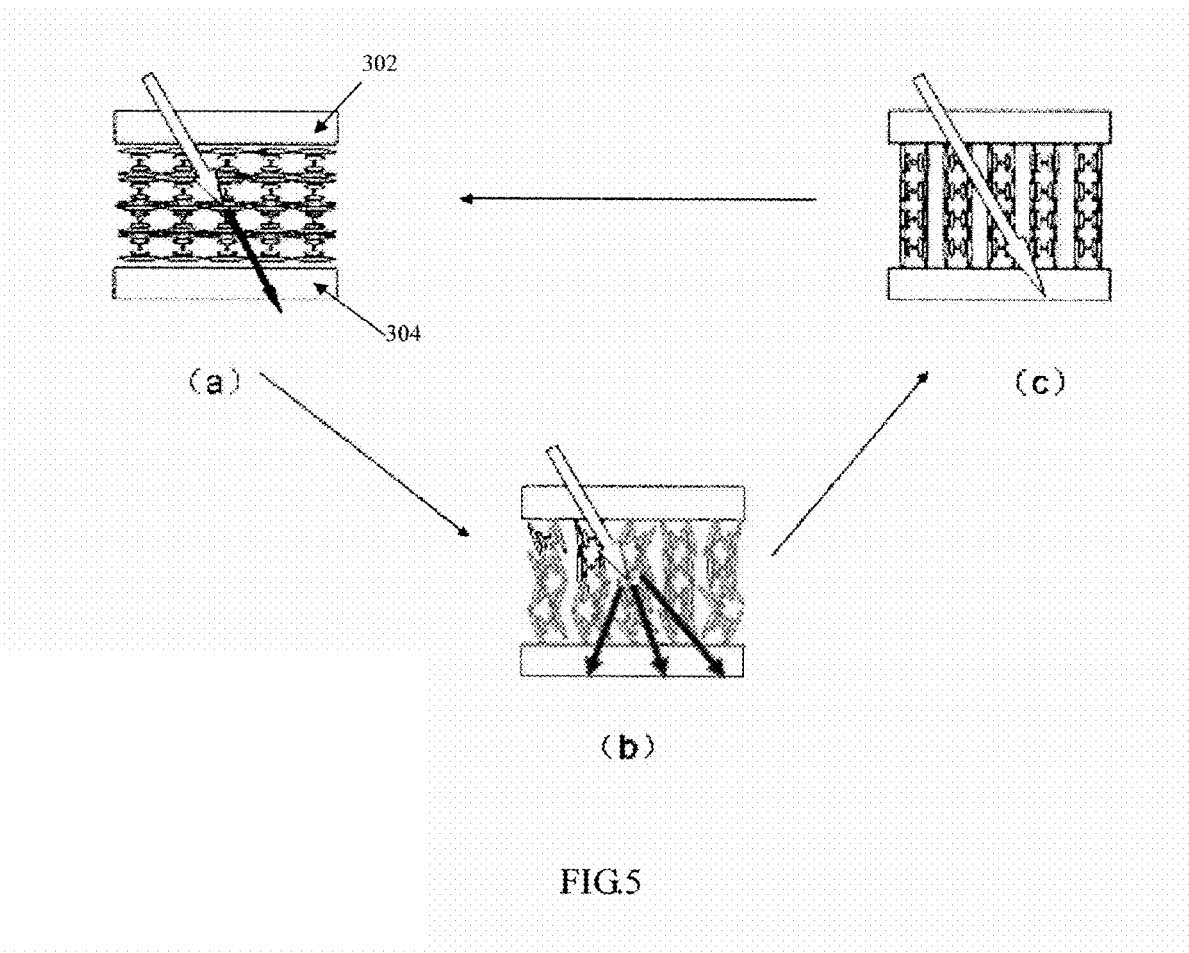
FIG. 5 is a schematic view showing the states of a cholesteric liquid crystal optical switch device in an embodiment.

For another example, as shown in FIG. 5, when the light valve component 21 is a cholesteric liquid crystal optical switch device, it is in a scattering state when a first predetermined voltage is applied across the third electrode 302 and the fourth electrode 304, and it is in a transparent state when a second predetermined voltage is applied across the third electrode 302 and the fourth electrode 304. The cholesteric phase liquid crystal has a pitch p and an effective refractivity n, so the Bragg reflective wavelength of the optical switch device can be expressed as $\lambda=np$. Visible light are all allowed to pass through when the condition is satisfied that the Bragg reflective wavelength is not within the range of visible light. The optical switch device has two stable states. At the beginning, the second substrate and the third substrate have the liquid crystal in a planar texture stable state because the alignment film (not shown) on each of them homogeneously aligns the liquid crystal, as shown in FIG. 5 (a), and at this time the optical switch device is in a transparent state. When a low voltage is applied across the third electrode and the fourth electrode, a focal conic texture stable state of the liquid crystal is incurred, as shown in FIG. 5 (b), and at this time the optical switch device is in a scattering state. When a high voltage is applied across the third electrode and the fourth electrode, the liquid crystal molecules are aligned perpendicularly along the formed electric field, through which light can all pass, and at this time the optical switch device is in a transparent state, as shown in FIG. 5 (c). If the voltage is quickly removed after the liquid crystal is stably distributed so as to form a planar texture with the lowest energy, the switch device is still in the transparent state.

For another example, when the light valve component 21 is an electrochromic optical switch device, it is in a transparent state when no voltage is applied and is in a scattering state when a predetermined voltage is applied across the third electrode and the fourth electrode. By mainly using a reversible oxidation reduction reaction, the electrochromic optical switch device allows the material molecules thereof to present transparently or in different colors in different valence states, and can realize a stable state or a metastable state in different conditions. The electrochromic optical switch device comprises a cathode material layer and an anode material layer between the third electrode and the fourth electrode. The cathode material layer is a cathode coloring layer, whose initial state is a homogeneous aqueous solution (viscosity being adjustable according to practical need) of a macromolecule material, a coloring material and an auxiliary material during manufacturing, and it is attached to an electrode (e.g. oxide indium tin (ITO)) after being applied as a film, and then formed into a solid state film after being dried. The anode material layer is usually a polymer electrolyte for the purpose of ion storage and conduction. The polymer electrolyte is a gel-like polymer electrolyte (similar to that used for lithium ion battery) formed of a viscous solution prepared with a mixture of various organic solvents after part of the solvents with low boiling points have been evaporated. For example, the glass substrate and electrodes used in the optical switch device are colorless and transparent. When no voltage is applied, the initial state of the electrochromic optical switch device is a transparent state. When a forward DC voltage (e.g. positive 1 to 3 volts) is applied across the third electrode and the fourth electrode for 1 to 20 seconds, the coloring layer is changed through the reversible oxidation reduction action from colorlessness into blue state or another color. In order to remove the color, a backward DC voltage (e.g. negative 1 to 3 volts) is applied for 1 to 20 seconds, and the optical switch device restores the transparent state.

Figure 6:
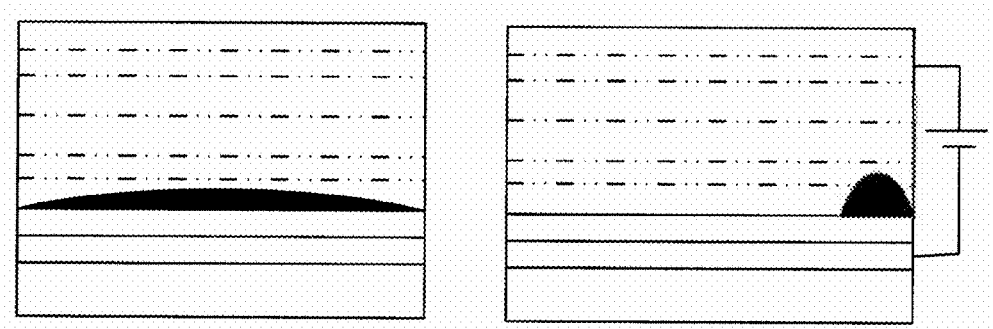
FIG. 6 is a schematic view showing the states of an electrowetting optical switch device in an embodiment.

For another example, when the light valve component 21 is an electrowetting optical switch device, it is in a non-transparent state when no voltage is applied, and it is in a transparent state when a predetermined voltage is applied across the third electrode and the fourth electrode. The electrowetting optical switch device is filled with a transparent electrolyte solution and a kind of colored liquid (e.g. ink) insoluble in the electrolyte solution. When no voltage is applied, as shown in FIG. 6, the colored liquid (ink) is distributed horizontally on an upper layer of the third substrate, and the device is in a dark state; when the voltage is applied, the colored liquid (ink) is drawn back to a side of the third substrate under the action of the electric field and the molecule tension, and thereby the light is allowed to pass through and the device is in a transparent state.

For another example, when the light valve component 21 is an optical switch device having a polarizer, it may be manufactured as an active optical switch device or a passive optical switch device. When the light valve component 21 is an active optical switch device, it is in a transparent state when no voltage is applied and is in a dark state when a voltage is applied across the third electrode and the fourth electrode. According to the specific structure, for example, the light valve component 21 may be in a dark state when no voltage is applied and in a transparent state when a voltage is applied. Such light valve component 21 realizes the transparent state and the dark state primarily by use of the optical deflection and retardation characteristics of the orthogonal polarizer and the liquid crystal.

Figure 7:
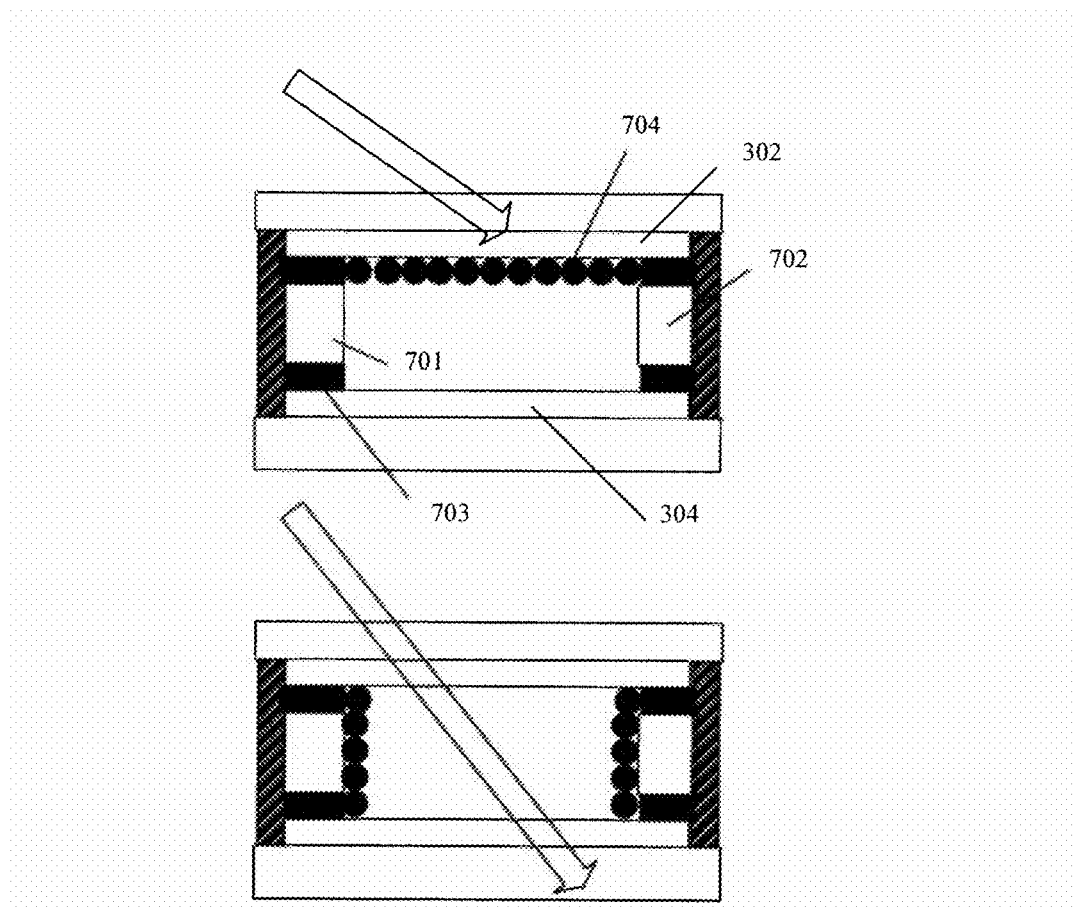
FIG. 7 is a schematic view showing the states of an electronic ink optical switch device in an embodiment.

As shown in FIG. 7, the light valve component 21 may also be an electronic ink optical switch device. When the light valve component 21 is an electronic ink optical switch device, it comprises, besides the third electrode 302 and the fourth electrode 304, a fifth electrode 701 and a sixth electrode 702 disposed between the second substrate 301 and the third substrate 303. The light valve component 21 is in a dark state when a first predetermined voltage is applied across the third electrode 302 and the fourth electrode 304, and it is in a transparent state when a second predetermined voltage is applied across the fifth electrode 701 and the sixth electrode 702 of the light valve component. To be specific, the fifth electrode 701 and the sixth electrode 702 are respectively isolated from the third electrode 302 and the fourth electrode 304 by insulating layers 703. When the voltage is applied across the third electrode 302 and the fourth electrode 304, black particles 704 in the transparent solution are distributed horizontally on the second substrate or the third substrate under the action of the electric field, so the device is in a dark state; when the voltage is applied across the fifth electrode 701 and the sixth electrode 702, the black particles 704 in the transparent solution are gathered on right and left sides under the action of the electric field and distributed perpendicular to the second substrate 301 and the third substrate 303, and thereby the light is allowed to pass through and the device is in a transparent state.

The above light valve components are only exemplarily listed and the present invention shall not be limited to these light valve components. As long as a light valve component can realize the transparent state and the non-transparent state under the action of the electric field, the light valve component may be used along with the transparent OLED display panel to switch between the transparent display effect and the ordinary non-transparent display effect.

In one exemplary embodiment of the present invention, the first electrode 202 and the second electrode 206 of the transparent OLED display panel are both made of transparent materials to realize two-way transparent display of the display device; that is, a user can view the normally displayed information from the front of the transparent OLED display panel, and also observe the exhibited items behind the display device or outside activities. Also, the display contents can be viewed from the rear of the display device. Such mode may realize the switching between the ordinary non-transparent display effect and the two-way transparent display effect through the switching between the states of the light valve components.

In another exemplary embodiment, the first electrode 202 of the transparent OLED display panel may be made of a non-transparent material which covers only a part of the pixel, while the second electrode 206 is made of a transparent material. For example, the first electrode 202 (i.e. the electrode adjacent to the rear of the display device, also called as "backside electrode") of the transparent OLED is made of an opaque metal material, and the width of the metal wire of the first electrode becomes thinner so that the metal wire of the first electrode only covers a part of the pixel. In this case, when the light valve component is in a transparent state, a user can view both the normally displayed information from the front of the transparent OLED display panel and the articles placed behind the display device through the pixel part not covered by the metal wire. Since the first electrode 202 is made of the opaque metal material and the light emitted from the OLED light emitting layer is mostly emitted from the front side, it is difficult to view the information displayed on the display panel from the rear of the display device when the light valve component is in the transparent state, and thereby the one-way transparent display effect is realized. Compared with the two-way transparent display, it enhances the safety and further improves the experience of the user. Such mode may realize the switching between the ordinary non-transparent display effect and the one-way transparent display effect through the switching between the states of the light valve components.

In one exemplary embodiment, a controlled switch is connected in series to a driving circuit connected between the third electrode 302 and the fourth electrode 304 of the light valve component 21, and the controlled switch controls the switching states thereof according to a received trigger signal. The switching states of the controlled switch control the light valve component to switch between the non-transparent state and the transparent state. The controlled switch may be carried out in various modes, e.g. a light-control switch (e.g.

infrared control), a touch-control switch (e.g. outside touch button), a key-control switch (e.g. external press key or press button) and etc.

In one exemplary embodiment, the light valve component may be controlled to perform local transparent display. For example, when the third electrode is disposed on the second substrate of the light valve component, the third electrode is set to comprise more than one electrode area, or when the fourth electrode is disposed on the third substrate, the fourth electrode is set to comprise more than one electrode area. The voltages applied to the different electrode areas of the third electrode or the fourth electrode are controlled, so that the corresponding regions are controlled to perform transparent display. In the present embodiment, a driving circuit of the light valve component may be provided and controlled by trigger signals to control the corresponding regions of the light valve component to switch between the non-transparent state and the transparent state and to realize local transparent display.

Figure 8:
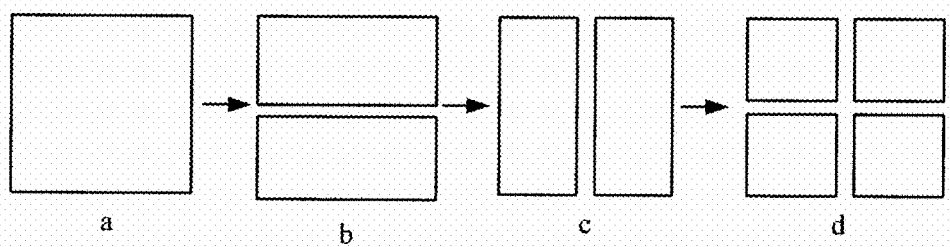
FIG. 8 is a structural schematic view of the electrode of the light valve component realizing local transparent display in an embodiment.

For example, as shown in FIG. 8, the third electrode comprises only one electrode area in FIG. 8 (a), while the fourth electrode comprises two electrode areas in FIG. 8 (b). When the third electrode is set as a common electrode, one of the electrode areas of the fourth electrode is set as a common electrode area, and the other of the electrode areas is set as an electrode area corresponding to a transparent display area, the transparent display may be realized in the upper half part or the lower half part of the display device. Similarly, when the fourth electrode adopts the structure shown in FIG. 8 (c), the transparent display may be realized in the left half part or the right half part; when the fourth electrode adopts the structure shown in FIG. 8 (d), the transparent display may be realized in one or more regions of the four regions. Based on the same principles, the third electrode may also be divided into two or more electrode areas, and the transparent display in partial areas may be realized by simultaneously controlling the voltages applied to the corresponding electrode areas of the third electrode and the fourth electrode.

In one exemplary embodiment, the transparent display in partial areas of the light valve component may be realized at accuracy of pixel level. In this example, pixel electrodes are disposed on the second substrate and the third substrate (e.g. both the second substrate and the third substrate of the light valve component are array substrates) and are driven by the driving circuit, so as to realize the transparent display effect in an area of any size and the switching between transparent display and non-transparent display in an area of any size.

An embodiment of the present invention further provides a manufacturing method for an organic light emitting diode display device in various situations as follows.

In the first situation, when both the first substrate of the transparent OLED display panel and the second substrate of the light valve component are rigid substrates, the manufacturing method of the OLED display device is as follows:

Step 901: forming a third electrode of the light valve component on the first substrate of the transparent OLED display panel.

The third electrode of the light valve component may be formed on the first substrate by using a sputtering process. Where it is necessary, the third electrode (e.g. ITO electrode) may be formed in further combination with a corresponding patterning process.

In this example, the third electrode of the light valve component is directly formed on the first substrate of the OLED display panel, i.e. the light valve component and the OLED share the first substrate in this case.

Preferably, the first substrate is thinned before the third electrode of the light valve component is formed thereon.

Step 902: forming a fourth electrode of the light valve component on the third substrate.

In this example, the fourth electrode (e.g. ITO electrode) may be formed on the third substrate by using a sputtering process.

Step 903: filling a display medium between the third electrode and the fourth electrode to form the light valve component. The light valve component having two states under the action of the formed electric field: transparent state and non-transparent state.

In an example of one manufacturing method, the third substrate and the first substrate are vacuum cell-assembled and cut after printing of the sealant; then, the display medium is filled between the third electrode and the fourth electrode by an injection process, and the third substrate is ultraviolet cured. Thus, the integration of the light valve component and the OLED display panel is realized.

In an example of the other manufacturing method, the third substrate and the first substrate are vacuum cell-assembled after the sealant printing and filling of the display medium by a drop filling process; then, the third substrate is ultraviolet cured to realize the integration of the light valve component and the OLED display panel; and finally, cutting is performed.

The display medium filled between the third electrode and the fourth electrode at least includes any one kind of polymer dispersed liquid crystal, cholesteric liquid crystal, electronic ink, and a mixture of ink and electrolyte. Examples are given herein only, and the display medium may be any solution that allows the light valve component to have the transparent state and the non-transparent state.

Figure 9:
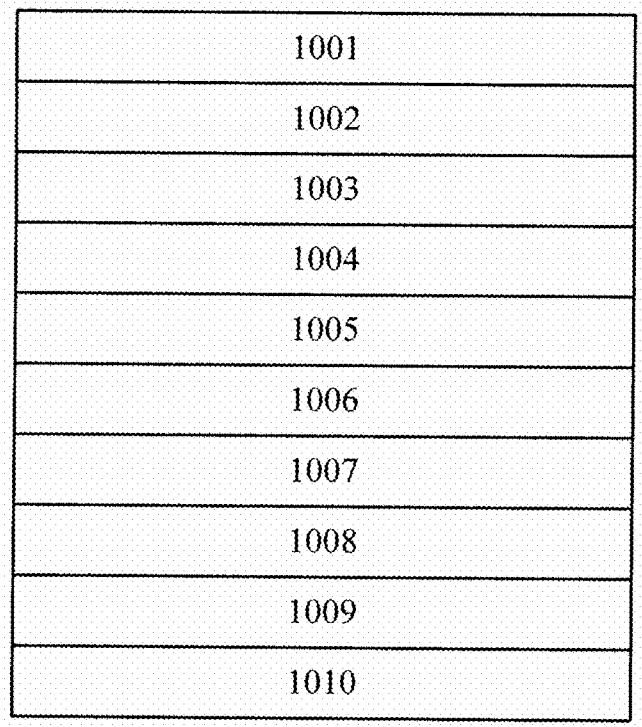
FIG. 9 is a cross-sectional structural schematic view of an OLED display device in an embodiment.

For example, FIG. 9 shows an exemplary cross-sectional structural schematic view of an OLED display device formed by the above manufacturing method. In FIG. 9, the reference sign 1001 refers to a transparent cathode, 1002 refers to an electron transport layer, 1003 refers to an organic light emitting layer, 1004 refers to a hole transport layer, 1005 refers to a transparent anode, 1006 refers to a glass substrate, 1007 refers to an ITO electrode, 1008 refers to a display medium, 1009 refers to an ITO electrode, and 1010 refers to a glass substrate.

In the second situation, when the first substrate of the transparent OLED display panel is a rigid substrate, a light valve component having a flexible substrate is attached onto the first substrate by an attaching device; or, when the first substrate is a flexible substrate, the light valve component having a flexible substrate is attached onto the first substrate by a roll-to-roll device. The light valve component at least has two states under electric fields: a transparent state and a non-transparent state.

Preferably, before attaching the light valve component having the flexible substrate onto the first substrate by the attaching device, or attaching the light valve component having the flexible substrate on the first substrate by the roll-to-roll device, a high transmittance material is filled between the light valve component and the first substrate. The high transmittance material has adhesiveness after ultraviolet curing or thermal curing, for example, the high transmittance material is polymethyl methacrylate (PMMA).

Further, an embodiment of the present invention further provides a display system comprising the aforesaid OLED display device, which can realize the switching between ordinary non-transparent display and transparent display of the display device, and in the OLED display device ordinary non-transparent display and transparent display are compatible with each other.

Preferably, the display system may further comprise a back plate protection device disposed behind the light valve component, and the back plate protection device may be made of a high transmittance material.

Figure 10:
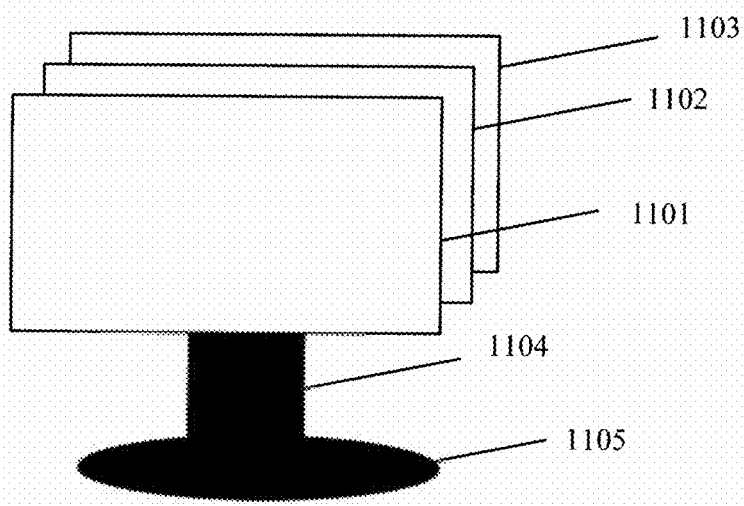
FIG. 10 is a structural schematic view of a display in an embodiment.

In particular, as shown in FIG. 10, in another exemplary embodiment, the display system further comprises a support post 1104 besides a transparent OLED display panel 1101, a light valve component 1102 behind the transparent OLED display panel, and a back plate protection device 1103 behind the light valve component 1102. The support post 1104 e.g. may be provided with a circuit board or a circuit signal transmission passage, and may be connected to a base 1105. For example, the base 1105 may be provided with a driving board, a control means, an outer end button or the like.

Figure 11:
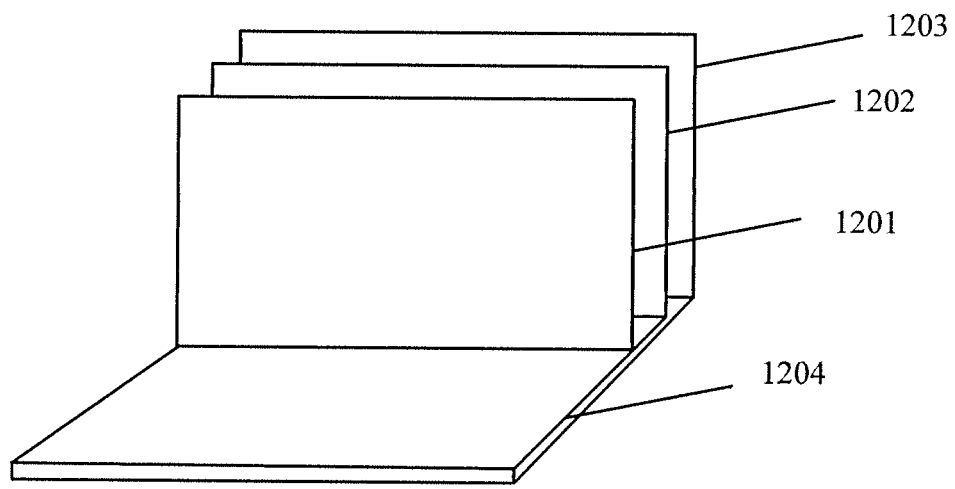
FIG. 11 is a structural schematic view of a portable computer in an embodiment.

For example, a touch control panel may be provided on a display surface of the OLED display panel. The touch control panel may be implemented in various manners, e.g., a touch screen of capacitance type, a resistance type or the like. For example, the display system may be a computer, a mobile terminal, a television and etc.. For example, the computer may be a desktop computer, a portable computer, a mobile phone, a flat panel computer, a handheld terminal and etc. FIG. 11 shows a structural schematic view of a portable computer to which the aforesaid display device is applied, and the reference sign 1201 refers to an OLED display panel, 1202 refers to a light valve component, 1203 refers to a back plate protection device with high transmittance, and 1204 refers to such a device as a driving board, a controller or an outer end keyboard, a button or the like.

Based on the above technical disclosure, an embodiment of the present invention disposes a light valve component on a non-display surface of the transparent OLED display panel, the light valve component having at least a transparent state and a non-transparent state under electric fields, such that the display device is in the transparent state when the light valve device is in the transparent state, and thus a user can view the objects behind the display device at the same time when information is normally displayed; and the display device realizes normal non-transparent display effect when the light valve component is in the non-transparent state. Therefore, the embodiment can realize the switching between ordinary non-transparent display and transparent display through the switching of the states of the light valve component, and thereby ordinary non-transparent display and transparent display is compatible with each other in the display device. In addition, disposing the light valve component on the non-display surface of an OLED display device can realize weight reducing and thinning of the display device, in which ordinary non-transparent display and transparent display is compatible with each other, by taking the advantage of light weight and thin profile of an OLED display device per se, and may improve the experience of users. The OLED display device provided in the embodiment of the present invention is widely applicable in display apparatuses in various fields, e.g. desktop computers, notebook computers, televisions, monitoring devices, mobile phones and other mobile terminals. It may also be applied to medical use monitors, display apparatuses in various exhibitions, or display apparatuses compatible with other additional functions.

The above embodiments of the present invention are given by way of illustration only and thus are not limitative for the protection scope of the present invention, which is determined by the attached claims.

The invention claimed is:

1. An organic light emitting diode display device, comprising:
   a transparent organic light emitting diode (OLED) display panel and a light valve component, wherein the light valve component is disposed on a non-display surface of the transparent OLED display panel; and the light valve component at least has two states under electric fields: a transparent state and a non-transparent state,
   the light valve component comprises a second substrate, a third electrode disposed on the second substrate, a third substrate, a fourth electrode disposed on the third substrate, and a display medium between the third electrode and the fourth electrode,
   the organic light emitting diode display device further comprising a driving circuit of the light valve component, the driving circuit, under control of trigger signals, controls the voltages applied to electrode areas of the third electrode and the fourth electrode of the light valve component so as to make corresponding areas to switch between the non-transparent state and the transparent state, and the third electrode or the fourth electrode each include more than one electrode area, and
   a driving circuit of the light valve component, the driving circuit, under control of trigger signals, controls the voltages applied to electrode areas of the third electrode and the fourth electrode of the light valve component so as to make corresponding areas to switch between the non-transparent state and the transparent state, and the third electrode or the fourth electrode each include more than one electrode area.

2. The device according to claim 1, wherein the transparent OLED display panel comprises a first substrate, and a first substrate, a first transport layer, a light emitting layer, a second transport layer and a second electrode sequentially disposed on the first substrate.

3. The device according to claim 1, wherein the light valve component comprises at least any one of a polymer dispersed liquid crystal optical switch device, a cholesteric liquid crystal optical switch device, an electrochromic optical switch device, an electrowetting optical switch device, and an optical switch device having a polarizer.

4. The device according to claim 1, wherein when the light valve component is an electronic ink optical switch device, the light valve component further comprises a fifth electrode and a sixth electrode which are disposed between the second substrate and the third substrate;
   the light valve component is in a non-transparent state when a first predetermined voltage is applied across the third electrode and the fourth electrode of the light valve component; and the light valve component is in a transparent state when a second predetermined voltage is applied across the fifth electrode and the sixth electrode of the light valve component.

5. The device according to claim 3, wherein when the light valve component is a polymer dispersed liquid crystal optical switch device, the light valve component is in a non-transparent state when no voltage is applied and in a transparent state when a predetermined voltage is applied across the third electrode and the fourth electrode;
   when the light valve component is a cholesteric liquid crystal optical switch device, the light valve component is in a non-transparent state when a first predetermined voltage is applied across the third electrode and the fourth electrode and in a transparent state when a second predetermined voltage is applied across the third electrode and the fourth electrode;

when the light valve component is an electrochromic optical switch device, the light valve component is in a transparent state when no voltage is applied and in a non\-transparent state when a predetermined voltage is applied across the third electrode and the fourth electrode;

when the light valve component is an electrowetting optical switch device, the light valve component is in a non-transparent state when no voltage is applied and in a transparent state when a predetermined voltage is applied across the third electrode and the fourth electrode; and when the light valve component is an optical switch device having a polarizer, the light valve component is in a transparent state when no voltage is applied and in a non\-transparent state when a voltage is applied across the third electrode and the fourth electrode.

6. The device according to claim 1, wherein a controlled switch is connected in series to a driving circuit connected between the third electrode and the fourth electrode, the controlled switch controls the switching states thereof according to a received trigger signal, and the switching states of the controlled switch controls the light valve component to switch between the non-transparent state and the transparent state.

7. The device according to claim 1, wherein the transparent OLED display panel and the light valve component share one substrate.

8. The device according to claim 2, wherein the first electrode and the second electrode are each made of a transparent material; or the first electrode is made of a non-transparent material and covers a portion of pixels, while the second electrode is made of a transparent material.

* * * * *